(12) United States Patent
Yamashita et al.

(10) Patent No.: US 7,764,090 B2
(45) Date of Patent: Jul. 27, 2010

(54) SEMICONDUCTOR DEVICE HAVING TRANSMITTER/RECEIVER CIRCUIT BETWEEN CIRCUIT BLOCKS

(75) Inventors: Hiroki Yamashita, Hachioji (JP); Ryo Nemoto, Saitama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/105,586

(22) Filed: Apr. 18, 2008

(65) Prior Publication Data

US 2008/0265973 A1 Oct. 30, 2008

(30) Foreign Application Priority Data

Apr. 25, 2007 (JP) .............................. 2007-115001

(51) Int. Cl.
*H03K 3/00* (2006.01)
(52) U.S. Cl. ........................................ 327/108; 326/82
(58) Field of Classification Search ................. None
See application file for complete search history.

(56) References Cited

U.S. PATENT DOCUMENTS

| | | | |
|---|---|---|---|
| 4,636,654 A * | 1/1987 | Lach ........................... | 327/103 |
| 7,259,589 B1 * | 8/2007 | Hui et al. ...................... | 326/63 |
| 7,339,421 B2 * | 3/2008 | Okamura ...................... | 327/563 |
| 2004/0222834 A1 * | 11/2004 | Frans et al. .................. | 327/165 |
| 2005/0088218 A1 * | 4/2005 | Shibata et al. ............... | 327/333 |

FOREIGN PATENT DOCUMENTS

JP 07-147092 6/1995
JP 08-162942 6/1996

OTHER PUBLICATIONS

Seevinck, et al., "Current-Mode Techniques for High-Speed VLSI circuits with application to Current Sense Amplifier for CMOS SRAM's," IEEE Journal of Solid-State Circuits, vol. 26, No. 4, pp. 525-536, Apr. 1991.

* cited by examiner

*Primary Examiner*—Tuan Lam
*Assistant Examiner*—Hiep Nguyen
(74) *Attorney, Agent, or Firm*—Antonelli, Terry, Stout & Kraus, LLP.

(57) ABSTRACT

A receiver circuit includes first and second constant current sources respectively connected to a pair of first and second receiving terminals to receive complementary current signals, a first NMOS transistor connected at a source thereof to the first receiving terminal and the first constant current source and connected at a drain thereof to a first power supply via a first output terminal and first load means, and a second NMOS transistor connected at a source thereof to the second receiving terminal and the second constant current source and connected at a drain thereof to the first power supply via a second output terminal and second load means.

7 Claims, 9 Drawing Sheets

FIG.2A  VOLTAGE DRIVE SCHEME (VOLTAGE RECEIVING)
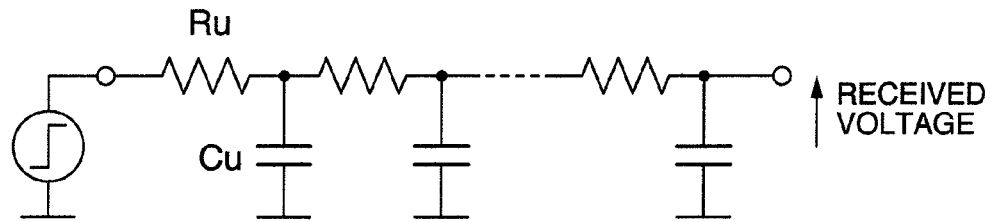
FIG.2B  CURRENT DRIVE SCHEME (CURRENT RECEIVING)
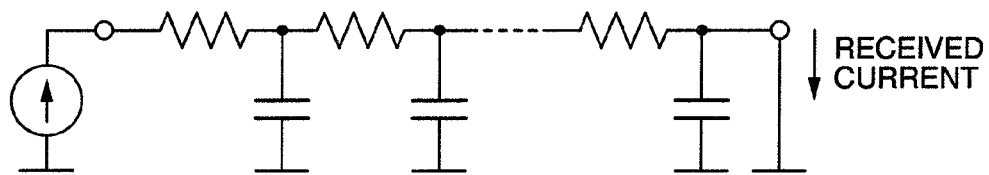
FIG.2C  RISE TIME CHARACTERISTICS
WIRING RESISTANCE PER LENGTH Ru : 510 Ω/mm
WIRING CAPACITANCE PER LENGTH Cu : 0.25 pF/mm @0.28μm PITCH
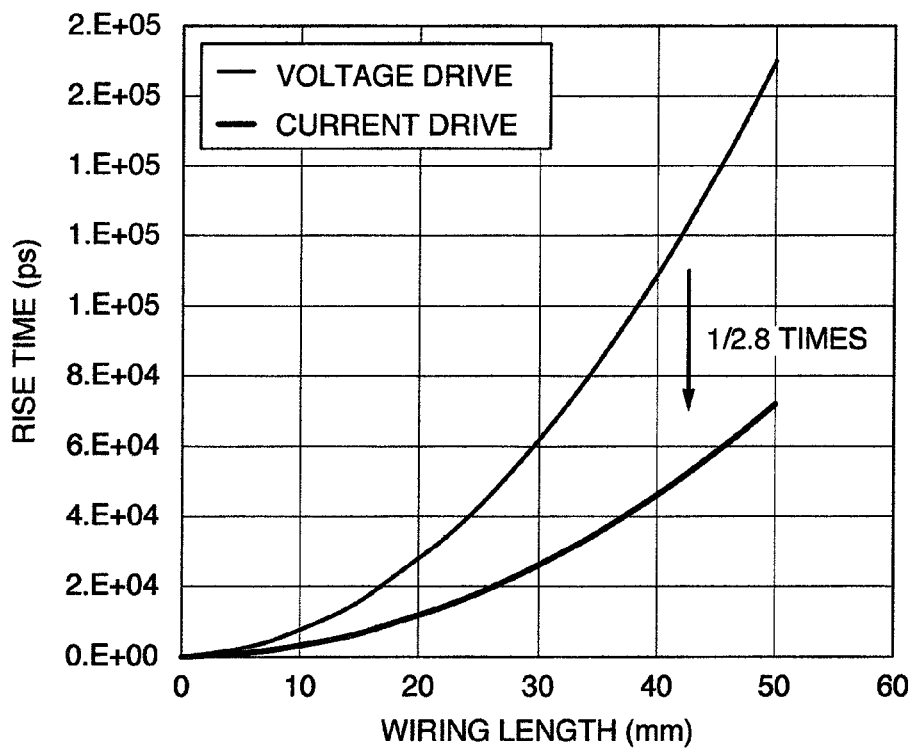

WIRING RESISTANCE Rt = Ru × L
WIRING CAPACITANCE Ct = Cu × L
L : WIRING LENGTH
Ru : WIRING RESISTANCE PER UNIT LENGTH
Cu : WIRING CAPACITANCE PER UNIT LENGTH

SEMICONDUCTOR DEVICE HAVING TRANSMITTER/RECEIVER CIRCUIT BETWEEN CIRCUIT BLOCKS

INCORPORATION BY REFERENCE

The present application claims priority from Japanese application JP2007-115001 filed on Apr. 25, 2007, the content of which is hereby incorporated by reference into this application.

BACKGROUND OF THE INVENTION

The present invention relates to a semiconductor device formed as an integrated circuit. In particular, the present invention relates to a technique of a long distance transmission circuit between circuit blocks provided on a semiconductor substrate.

On-chip wiring formed on the semiconductor substrate can be represented by a distributed constant line formed of wiring resistance Ru and wiring capacitance Cu as shown in FIG. 9. Especially in recent years, the wiring resistance Ru is increased remarkably by finer wiring in the on-chip long distance transmission on the semiconductor substrate. As a result, bluntness of the received waveform caused by the wiring resistance Ru and wiring capacitance Cu becomes large, resulting in a great obstacle to fast transmission.

As for schemes for transmitting signals over a long distance transmission line which are not restricted to the top of the semiconductor substrate, two transmitter-receiver circuit schemes are basically known. One of them is the voltage transmission scheme shown in FIG. 2A in which voltage signals are transmitted and received in a transmission system having an open receiving end, and it is s scheme used most frequently in transmission on a semiconductor substrate. The other of them is a current transmission scheme shown in FIG. 2B in which current signals are transmitted and received in a transmission system having a terminated receiving end. Results obtained by applying the two schemes to long distance transmission using fine wiring on the semiconductor substrate and comparing rise time values of received waveforms are shown in FIG. 2C. In FIG. 2C, it is supposed that the wiring pitch is approximately 0.28 μm and the wiring resistance Ru and the wiring capacitance Cu per unit length are 510 Ω/mm and 0.25 pF/mm, respectively. As appreciated from FIG. 2C as well, the current transmission scheme is approximately 2.8 times faster than the voltage transmission scheme. The current transmission scheme brings about an effect obtained by making the output impedance of the transmitter circuit and the terminal impedance at the receiving end smaller than the wiring resistance Rt. This effect is brought about by a phenomenon called in general Thomson's arrival current phenomenon. As for a current transmission scheme for conducting transmission by using wiring formed on a semiconductor substrate, a circuit intended to detect and amplify data stored in a memory cell array in an SRAM and described in "Current-Mode Techniques for High-Speed VLSI circuits with application to Current Sense Amplifier for CMOS SRAM's," IEEE JOURNAL OF SOLID-STATE CIRCUITS, VOL. 26, NO. 4, PP. 525-536, April 1991. is widely used. In this circuit, however, a memory cell corresponding to a transmission circuit is driven by a constant current source, and consequently its output impedance becomes much higher than the wiring resistance, the effect of the above-described phenomenon being not obtained. On the other hand, as for a known technique of a conventional transmission circuit capable of utilizing the effect of the above-described phenomenon, JP-A-7-147092 and JP-A-8-162942 can be mentioned.

FIG. 7 shows a current transmission circuit formed of bipolar transistors and described in JP-A-7-147092. In this current transmission circuit, Q3 in a transmitter circuit 101 and Q5 in the receiver circuit 102 constitute a current switch circuit, and Q4 in a transmitter circuit 101 and Q6 in the receiver circuit 102 constitute another current switch circuit. For example, when an input terminal INp in the transmitter circuit 101 is at its high level and an input terminal INn in the transmitter circuit 101 is at its low level, a base potential of Q3 becomes its high level and a base potential of Q4 becomes its low level. If the base potential of Q3 becomes higher than the base potential VB of Q5, a current which has flown through a resistor in the transmitter circuit 101 and a constant current source I2 until then begins to flow through Q3. If the base potential of Q3 becomes higher than the base potential VB of Q5 by a voltage drop ΔVR caused by wiring 103, all of the current flows through Q3. A relation between Q4 and Q6 is opposite to the relation between Q3 and Q5. Therefore, all of a current flowing through a resistor RL2 and a constant current source I3 which has flown through Q4 until then flows through Q6. Since Q5 turns off, an output terminal Op in the receiver circuit 102 goes high. Since Q6 turns on, an output terminal On goes low. As a result, a voltage signal is output to the output terminals. In this circuit scheme, current signal transmission is implemented by exchanging a current flowing through the resistor RL1 and the constant current source I2 or through the resistor RL2 and the constant current source I3 between the transmitter circuit and the receiver circuit as a current signal. Since a current is always let flow through Q3 and Q4 in the transmitter circuit 101 and Q5 and Q6 in the receiver circuit 102, impedance seen from each of emitters of these transistors becomes very small. As a result, both output impedance of the transmitter circuit and the input impedance of the receiver circuit can be made smaller than the wiring resistance. Therefore, the speed increase effect owing to the Thomson's arrival current effect is obtained. Even if bipolar transistors in the circuit shown in FIG. 7 are replaced by NMOS transistors, similar transmission is possible.

FIG. 8 shows a current transmission circuit formed of MOS transistors and described in JP-A-8-162942. In this current transmission circuit, a current generated by a constant current source I1 in the transmitter circuit 101 flows through wiring 103 or 104 according to potentials at input terminals INp and INn. For example, when the input terminal INp in the transmitter circuit 101 is at its high level and the input terminal INn is at its low level, Q1 turns off and Q2 turns on, and consequently output terminals Dp and Dn in the transmitter circuit 101 becomes the high level and low level, respectively. Since Q2 turns on, a current Il of the constant current source I1 is drawn from an input terminal of the receiver circuit 102 via the wiring 104 at this time. On the other hand, since Q1 turns off, a current Ih obtained by dividing a potential difference between an input terminal Rp in the receiver circuit 102 and a power supply VDD by a sum of load resistance R1 and wiring resistance Rt of the wiring 103 flows into the input terminal Rp in the receiver circuit 102. As a result, a potential difference caused between load means L3 and L4 by Il and Ih is output between output terminals On and Op in the receiver circuit 102 as a voltage signal. In this circuit scheme, current signal transmission is implemented by exchanging the current Ih which flows out when the output of the transmitter circuit is at its high level and the current Il of the constant current source I1 between the transmitter circuit and the receiver circuit as current signals. In this circuit as well, the speed increase effect owing to the Thomson's arrival current effect can be obtained by setting resistances R1 and R2 in the transmitter circuit 101 smaller than the wiring resistance Rt and always letting currents flow through Q11 and Q12 and thereby making the input impedance of the receiver circuit lower than the wiring resistance.

SUMMARY OF THE INVENTION

In the conventional art shown in FIG. 7, a current component flowing into the resistor RL1 in the current signal depends upon the potential at the receiving terminal Rp in the receiver circuit 102, the wiring resistance Rt of the wiring 103 and the resistor RL1. Since the potential at the receiver terminal Rp in the receiver circuit 102 depends upon the base bias voltage VB of Q5 and Q6, therefore, the current signal exchanged between the transmitter circuit and the receiver circuit depends upon the wiring resistance Rt of the wiring 103 and the bias voltage VB. In addition, in the conventional art shown in FIG. 8 as well, the current signal exchanged between the transmitter circuit and the receiver circuit, i.e., the current Ih which flows out when the output of the transmitter circuit is its high level depends upon the potential at the receiver terminal Rp in the receiver circuit 102, the wiring resistance Rt of the wiring 103 and the resistance R1. Since the potential at the input terminal Rp in the receiver circuit 102 depends upon the gate bias voltage VB of Q13 and Q14, therefore, the current signal in the circuit shown in FIG. 8 also depends upon the wiring resistance Rt of the wiring 103 and the bias voltage VB. In both conventional circuits, the current signal between the transmitter circuit and the receiver circuit depends upon the wiring resistance and the bias voltage VB as heretofore described. Furthermore, in both conventional circuits, conversion to a voltage signal is conducted by using the voltage drop caused by the current signal and the load resistor in the receiver circuit as described earlier. If the wiring resistance or the bias voltage VB varies, therefore, the current signal varies greatly and consequently the output voltage signal in the receiver circuit varies greatly, resulting in a fear of false operation of the circuit. For suppressing the variation of the current signal, it is necessary to adjust the load resistor in the receiver circuit or the bias voltage VB according to the wiring length.

Therefore, an object of the present invention is to provide a transmitter circuit and a receiver circuit of a current transmission scheme, in transmission using wiring between blocks on a semiconductor substrate, capable of suppressing the variation of the current signal caused by variations of the wiring resistance and bias voltage which pose a problem in the conventional circuits and implementing stable signal transmission.

Outlines of representative aspects of the present invention which will be disclosed herein will now be described briefly.

A receiver circuit included in a transmitter-receiver circuit between circuit blocks of a semiconductor device includes first and second constant current sources respectively connected to a pair of first and second receiving terminals to receive complementary current signals, a first NMOS transistor connected at a source thereof to the first receiving terminal and the first constant current source and connected at a drain thereof to a first power supply via a first output terminal and first load means, and a second NMOS transistor connected at a source thereof to the second receiving terminal and the second constant current source and connected at a drain thereof to the first power supply via a second output terminal and second load means. A gate voltage of the second NMOS transistor is controlled by a voltage signal which is the same in phase with a voltage signal at the first output terminal, and a gate voltage of the first NMOS transistor is controlled by a voltage signal which is the same in phase with a voltage signal at the second output terminal. A current receiver circuit which does not need the bias voltage VB needed in the conventional circuit can be implemented by using the above-described configuration in the receiver circuit.

In addition, a transmitter circuit includes a pair of first and second input terminals to receive complementary input voltage signals, a pair of sending terminals to output complementary current signals according to the complementary input voltage signals, a third NMOS transistor connected at a gate thereof to the first input terminal, connected at a source thereof to the first sending terminal, and connected at a drain thereof to a second power supply, and a fourth NMOS transistor connected at a gate thereof to the first input terminal, connected at a source thereof to the second sending terminal, and connected at a drain thereof to the second power supply.

In the receiver circuit having the above-described feature, the bias voltage needed in the conventional circuit becomes unnecessary. Unlike the conventional circuit, therefore, variations caused in the current signals between the transmitter circuit and the receiver circuit by variations of the bias voltage VB can be prevented. As a result, variations of voltage signals in the receiver circuit can also be prevented and stable signal transmission becomes possible. In addition, the first NMOS transistor in the receiver circuit and the third NMOS transistor in the transmitter circuit constitute a current switch circuit, and the direction in which the current signals flow through wiring between blocks is changed according to a magnitude relation between gate voltages. Unlike the conventional circuit, the current signals depend upon the current of the first constant current source in the receiver circuit, and the current signals do not depend upon the wiring resistance. A similar operation is conducted in a current switch circuit formed of the second NMOS transistor and the fourth NMOS transistor as well. Therefore, the current signals are not varied by the wiring resistance. Accordingly, variations of the voltage signals in the receiver circuit can also be prevented, and stable signal transmission becomes possible.

Other objects, features and advantages of the invention will become apparent from the following description of the embodiments of the invention taken in conjunction with the accompanying drawings.

BRIEF DESCRIPTION OF THE DRAWINGS

FIGS. 2A-2C show results obtained by comparing rise time of a received waveform in voltage transmission with that in current transmission when long distance transmission is conducted by using fine wiring on a semiconductor substrate;

DETAILED DESCRIPTION OF THE INVENTION

Hereafter, embodiments of the present invention will be described in detail with reference to the drawings. Throughout all drawings for describing the embodiments, the same components are denoted by like characters in principle, and their repeated description will be omitted.

First Embodiment

Figure 1:
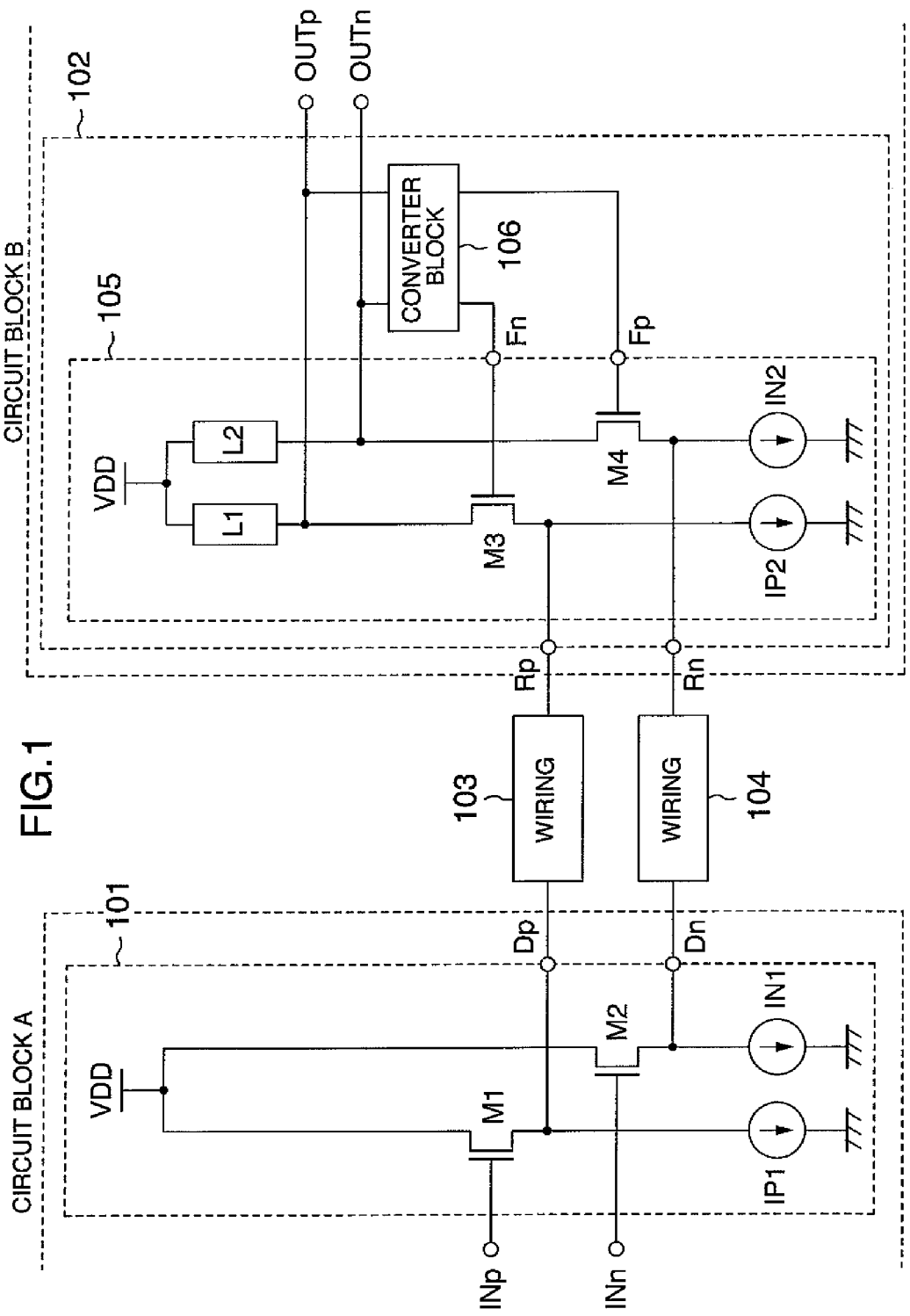
FIG. 1 is a block diagram showing a basic configuration of a transmitter-receiver circuit between circuit blocks according to an embodiment of the present invention included in a plurality of circuit blocks provided on a semiconductor substrate.

FIG. 1 shows a circuit configuration of a principal part of a semiconductor device according to a first embodiment. The semiconductor device according to the present embodiment includes a plurality of circuit blocks on the same semiconductor substrate. There is a feature of the present embodiment in a part for transmitting a signal from a transmitter circuit in one of the circuit blocks to a receiver circuit in another one of the circuit blocks. FIG. 1 shows the feature part.

The transmitter/receiver circuit between blocks includes a transmitter circuit 101, a receiver circuit 102, and wiring 103 and 104 between blocks. Signal transmission between the transmitter circuit 101 and the receiver circuit 102 is conducted by using current signals. The transmitter circuit 101 includes an NMOS transistor M1 connected at its gate to an input terminal INp, connected at its drain to a power supply VDD, and connected at its source to ground via a constant current source IP1, and an NMOS transistor M2 connected at its gate to another input terminal INn, connected at its drain to the power supply VDD, and connected at its source to the ground via a constant current source IN1. The receiver circuit 102 includes a current receiver block 105 and a level converter block 106. The current receiver block 105 includes an NMOS transistor M3 connected at its gate to an output terminal Fn of the level converter block 106, connected at its drain to the power supply VDD via load means L1, and connected at its source to the ground via a constant current source IP2, and an NMOS transistor M4 connected at its gate to an output terminal Fp of the level converter block 106, connected at its drain to the power supply VDD via load means L2, and connected at its source to the ground via a constant current source IN2. The output terminal Fn of the level converter block 106 has a potential obtained by applying level shift of Vs to a potential at an output terminal OUTn of the receiver circuit 102 pulled out from the drain of the NMOS transistor M4. The output terminal Fp of the level converter block 106 has a potential obtained by applying level shift of Vs to a potential at an output terminal OUTp of the receiver circuit 102 pulled out from the drain of the NMOS transistor M3. It is now supposed that voltage amplitude at the input terminals INp and INn and voltage amplitude at the output terminals OUTp and OUTn are Va. The level shift quantity Vs in the level converter block 106 is set so as to satisfy the following condition.

Level shift quantity $Vs > \Delta Vrs - Va$

Here, each of the constant current sources IP1, IP2, IN1 and IN2 has a current value Is. $\Delta Vrs$ is the product of the wiring resistance Rt of wiring (103 or 104) between blocks and the current Is of the constant current sources IP1, IP2, IN1 and IN2.

Outline of the operation of the present circuit will now be described. The potential at the power supply VDD is set equal to 1.2 V. As for the input level of the receiver circuit 101, its high level VIH1 is set equal to 1.2 V and its low level VOL1 is set equal to 0.9 V. Total wiring resistance of the wiring 103 and 104 between blocks is denoted by Rt. First, the case where the input terminal INp is at its high level and the input terminal INn is at its low level will now be described. If the potential at the input terminal INp becomes the high level 1.2 V, all of the current of the constant current source IP2 flows through a route including the NMOS transistor M1 and the wiring 103. Since the potential at the gate Fn is lower than a potential obtained by subtracting a voltage drop $\Delta VRt$ (=current of IP2×Rt) caused by the wiring resistance Rt and the constant current source IP2 from the input high level VIH, i.e., 1.2 V, the NMOS transistor M3 is cut off. As a result, the potential at the output terminal OUTp in the receiver circuit 102 rises up to the potential at the power supply VDD and becomes the high level VOH, i.e., 1.2 V. On the other hand, if the potential at the input terminal INn becomes the low level, i.e., 0.9 V, then the NMOS transistor M2 is cut off, all of the current of the constant current source IN1 flows through a route including the NMOS transistor M4 and the wiring 104. All of currents of the constant current sources IN1 and In2 flows through the NMOS transistor M4. As a result, all of the currents of the constant current sources IN1 and IN2 flows through the load means L2. Therefore, the potential at the output terminal OUTn of the receiver circuit 102 becomes the low level VOL, i.e., 0.9 V. As for the output signal, therefore, its high level is the potential at the power supply VDD whereas its low level depends upon the currents of the constant current sources IP1, IP2, IN1 and IN2 and the load means L1 and L2. Accordingly, the output signal does not depend upon the wiring resistance Rt, and the bias voltage VB is not needed.

In the circuit according to the present invention, signal transmission is conducted between the transmitter circuit 101 and the receiver circuit 102 by exchanging the currents of the constant current sources IP1 and IN1, and IP2 and IN2 via wiring 103 and 104, conversion to voltage signals is conducted in the receiver circuit 102, and the voltage signals are output, as heretofore described. In the circuit according to the present embodiment shown in FIG. 1, the current signals do not vary according to the wiring resistance. Therefore, variation of the output voltage signals of the receiver circuit can also be suppressed, and stable signal transmission becomes possible.

Second Embodiment

Figure 3:
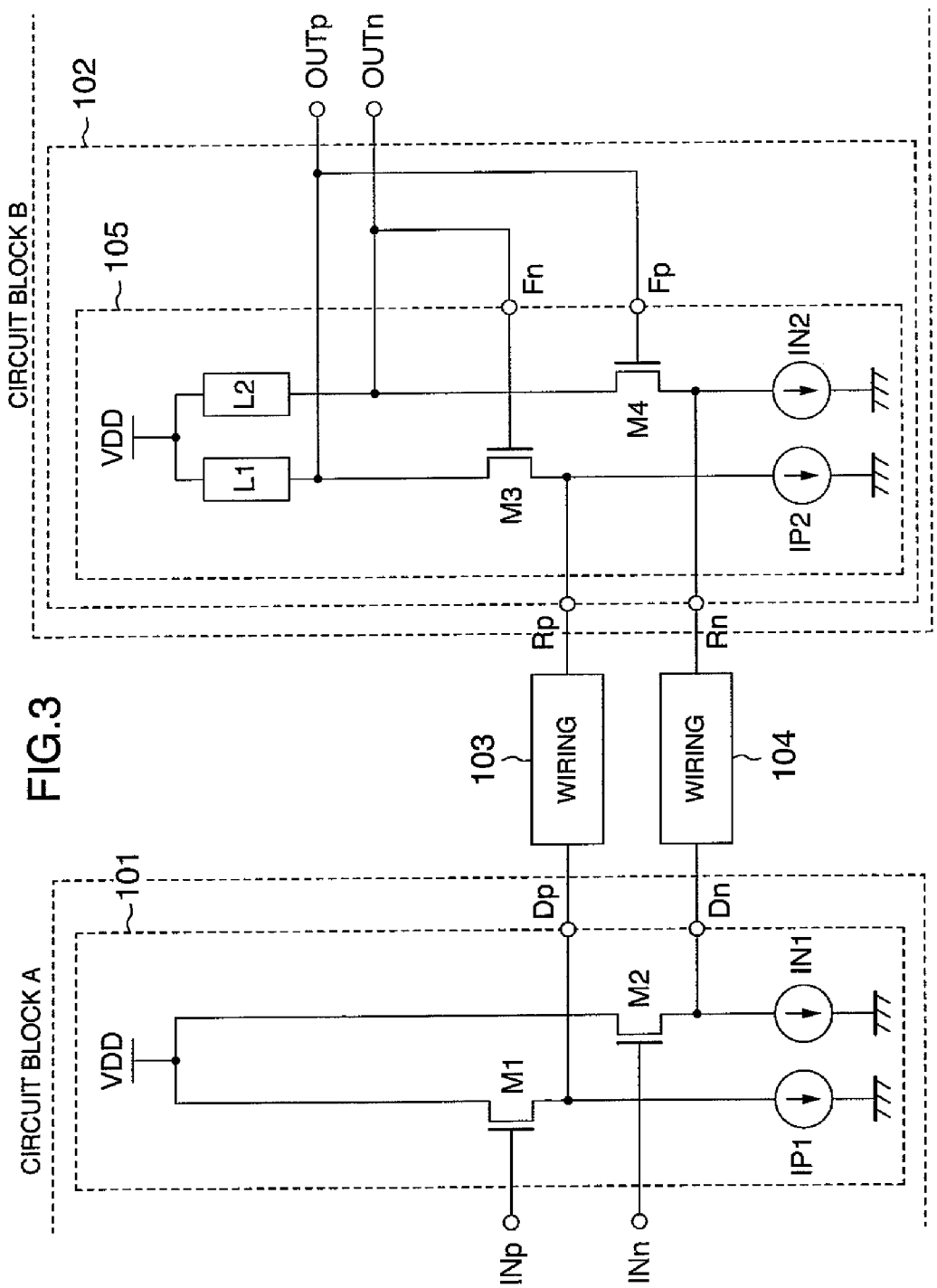
FIG. 3 is a block diagram showing a basic configuration of a transmitter-receiver circuit between circuit blocks according to another embodiment of the present invention.

FIG. 3 shows a circuit configuration of a principal part of a semiconductor device according to a second embodiment.

In this embodiment, the output terminal OUTp pulled out from the drain of the NMOS transistor M3 is connected to the gate of the NMOS transistor M4, and the output terminal OUTn pulled out from the drain of the NMOS transistor M4 is connected to the gate of the NMOS transistor M3. In other words, the configuration in the present embodiment is a configuration obtained by setting the level shift quantity Vs of the level converter block 106 in the receiver circuit 102 shown in FIG. 1 equal to 0 V. Even if the level shift quantity Vs of the level converter block 106 is 0 V, operation similar to that in the embodiment shown in FIG. 1 becomes possible provided that the following expression is satisfied:

Level shift quantity $Vs > \Delta Vrs - Va$

In other words, if the input amplitude and output amplitude Va is set greater than the voltage drop ΔVrs caused by the constant current source IP1, IP2, IN1 or IN2 and the wiring resistance Rt of the wiring 103 or 104, then the high level of the output signal is the potential at the power supply VDD and the low level of the output signal depends upon the current of the constant current source IP1, IP2, IN1 or IN2 and the load means L1 and L2. Therefore, the current signals do not depend upon the wiring resistance, and stable signal transmission becomes possible.

Third Embodiment

Figure 4:
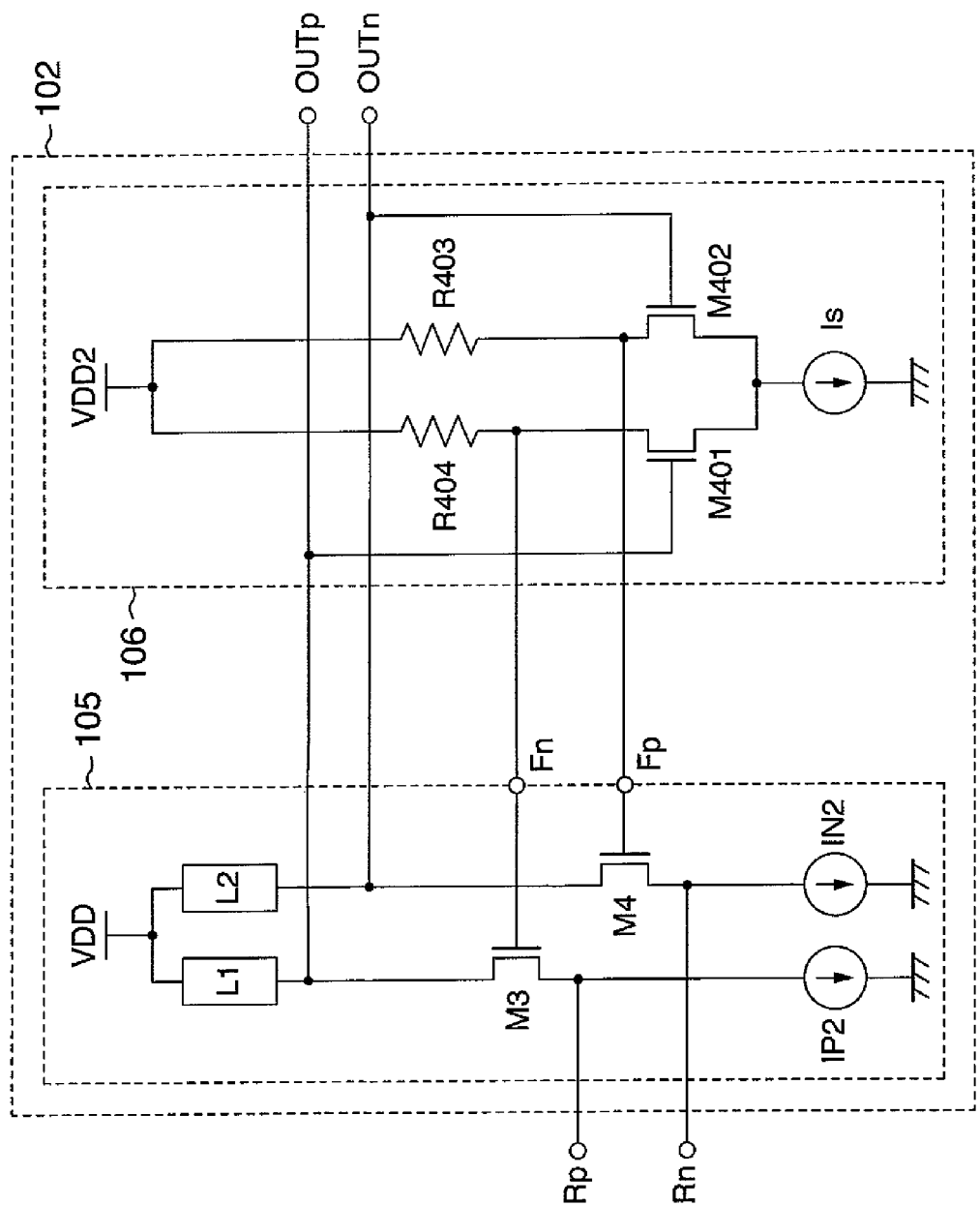
FIG. 4 is a block diagram showing a basic configuration of a transmitter-receiver circuit between circuit blocks according to still another embodiment of the present invention.

FIG. 4 shows a circuit configuration of a principal part of a semiconductor device according to a third embodiment.

In this embodiment, the level converter block 106 in the receiver circuit 102 is formed of an amplifier circuit. In other words, the output terminal OUTp of the receiver circuit 102 is connected to an NMOS transistor M401 at its gate. The NMOS transistor M401 is connected at its drain to a power supply VDD2 via load means R404 and to the output terminal Fn of the level shift circuit. In the same way, the output terminal OUTn of the receiver circuit 102 is connected to an NMOS transistor M402 at its gate. The NMOS transistor M402 is connected at its drain to the power supply VDD2 via load means R403 and to the output terminal Fp of the level shift circuit. Sources of the NMOS transistors M401 and M402 are connected in common, and a current source Is is connected to the common code.

Depending upon the potential relation between the output terminals OUTp and OUTn, the current of the constant current source Is flows through either the load means R404 or R403. As a result, potentials at the output terminals Fn and Fp of the level converter block 106 are determined. For example, if the potential at the output terminal OUTp is high level and the potential at OUTn is low level, then the NMOS transistor M401 turns on and the NMOS transistor M402 turns off, and all of the current of the constant current source Is flows through the load means R404. Accordingly, the potential at the terminal Fn falls, and the potential at the terminal Fp rises up to the potential at the power supply VDD. Therefore, the signal voltage of the terminals Fn and Fp depends upon the product Va1 of the current of the constant current source Is and the resistance of the load means R403 or R404. If the output amplitude Va1 is set greater than the voltage drop ΔVrs caused by the constant current source IP1, IP2, IN1 or IN2 and the wiring resistance Rt of the wiring 103 or 104, then the high level of the output signal is the potential at the power supply VDD and the low level of the output signal depends upon the current of the constant current source IP1, IP2, IN1 or IN2 and the load means L1 and L2. Therefore, the current signals do not depend upon the wiring resistance, and stable signal transmission becomes possible.

Fourth Embodiment

Figure 5:
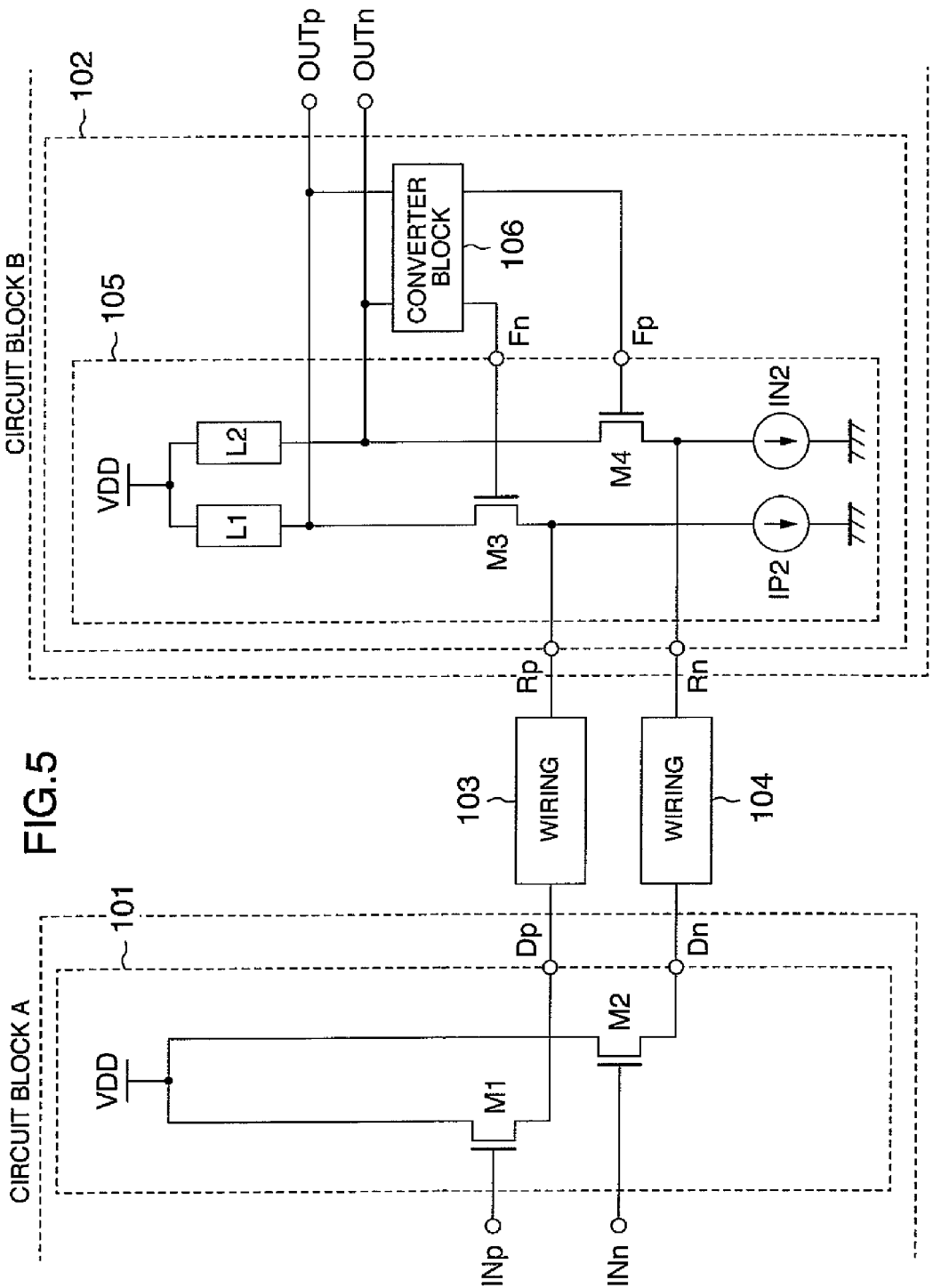
FIG. 5 is a block diagram showing a basic configuration of a transmitter-receiver circuit between circuit blocks according to yet another embodiment of the present invention.

FIG. 5 shows a circuit configuration of a principal part of a semiconductor device according to a fourth embodiment. The present embodiment is obtained by removing the constant current sources IP1 and IN1 from the transmitter circuit 101 and forming the transmitter circuit in the embodiment shown in FIG. 1 of the NMOS transistors M1 and M2. The receiver circuit has the same configuration as that of the receiver circuit 102 in the first embodiment shown in FIG. 1.

In this configuration as well, a route through which the current of the constant current source IP2 flows depends upon the potential relation between the input terminal INp and the gate Fn of the NMOS transistor M3 in the receiver circuit 102. Furthermore, a route through which the current of the constant current source IN2 flows depends upon the potential relation between the input terminal INn and the gate Fp of the NMOS transistor M4. A current flows through either the NMOS transistor M1 or M2 in the transmitter circuit 101, and a current flows through either the NMOS transistor M3 or M4 in the receiver circuit 102. As a result, current signal transmission and conversion of the received current to voltage are conducted. If the potential at the gate Fn of the NMOS transistor M3 is lower than VIH−ΔVrs when the input terminal INp is at the high level VIH, then the NMOS transistor M1 turns on and the NMOS transistor M3 turns off. Therefore, all of the current of the constant current source IP2 flows through the NMOS transistor M1. As a result, the potential at the output terminal OUTp rises up to the potential at the power supply VDD and it becomes the high level. On the other hand, the input terminal INn is at its low level. If the potential at the gate Fp of the NMOS transistor M4 in the receiver circuit 102 is higher than VIL+ΔVrs, therefore, the NMOS transistor M2 in the transmitter circuit 101 turns off and the NMOS transistor M4 in the receiver circuit 102 turns on. Therefore, all of the current of the constant current source IN2 flows through the NMOS transistor M4 and the load means L2. As a result, a voltage drop equivalent to the product of the current of the constant current source IN2 and the resistance of the load means L2 occurs at the output terminal OUTn, and the potential at the output terminal OUTn becomes the low level. Therefore, the voltage signals at the output terminals OUTp and OUTn depend upon the constant current source IP2 and IN2 and the load means L1 and L2. Accordingly, the voltage signals do not depend upon the wiring resistance Rt and stable signal transmission becomes possible.

Fifth Embodiment

Figure 6:
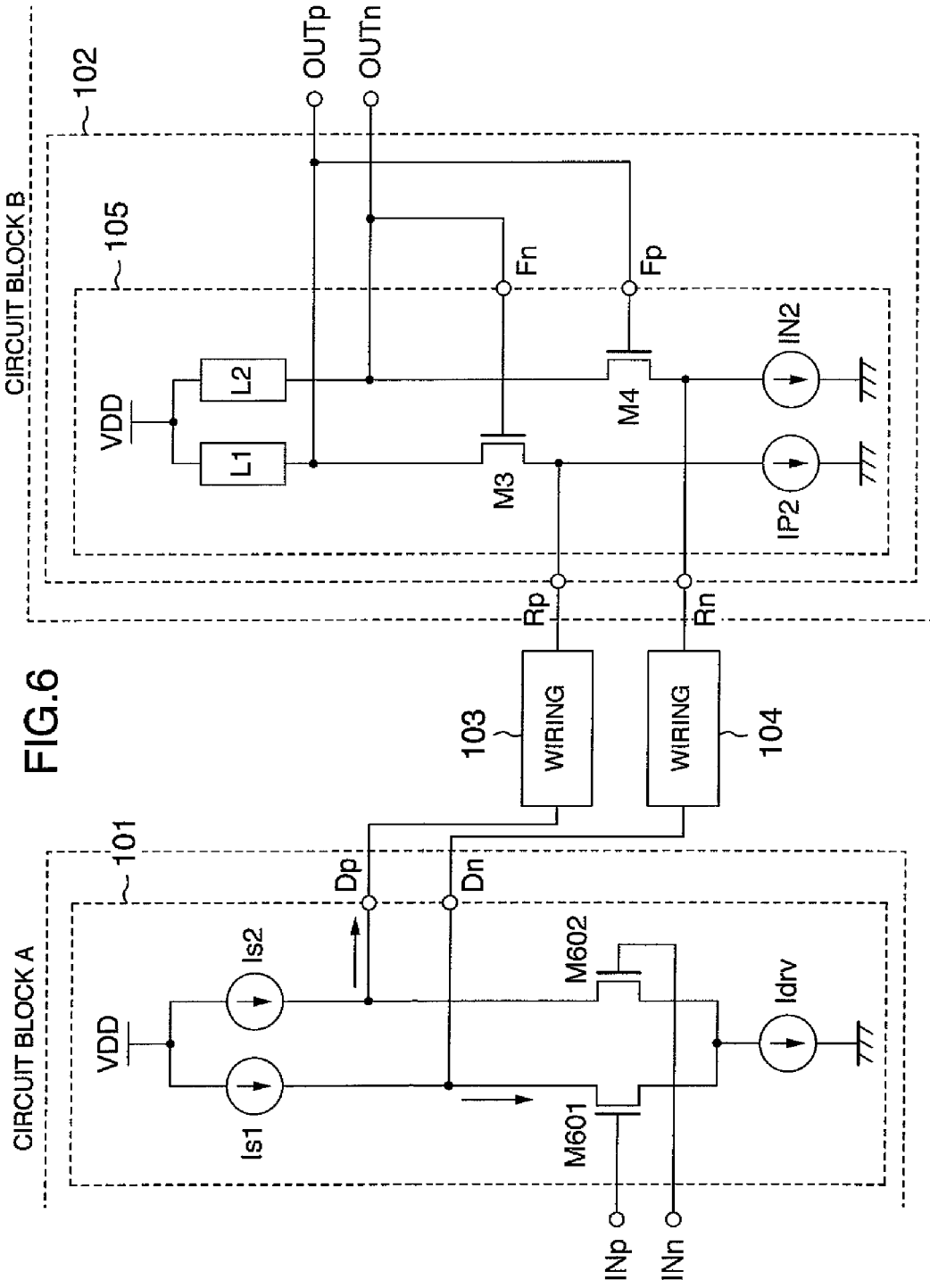
FIG. 6 is a block diagram showing a basic configuration of a transmitter-receiver circuit between circuit blocks according to still yet another embodiment of the present invention.
Figure 7:
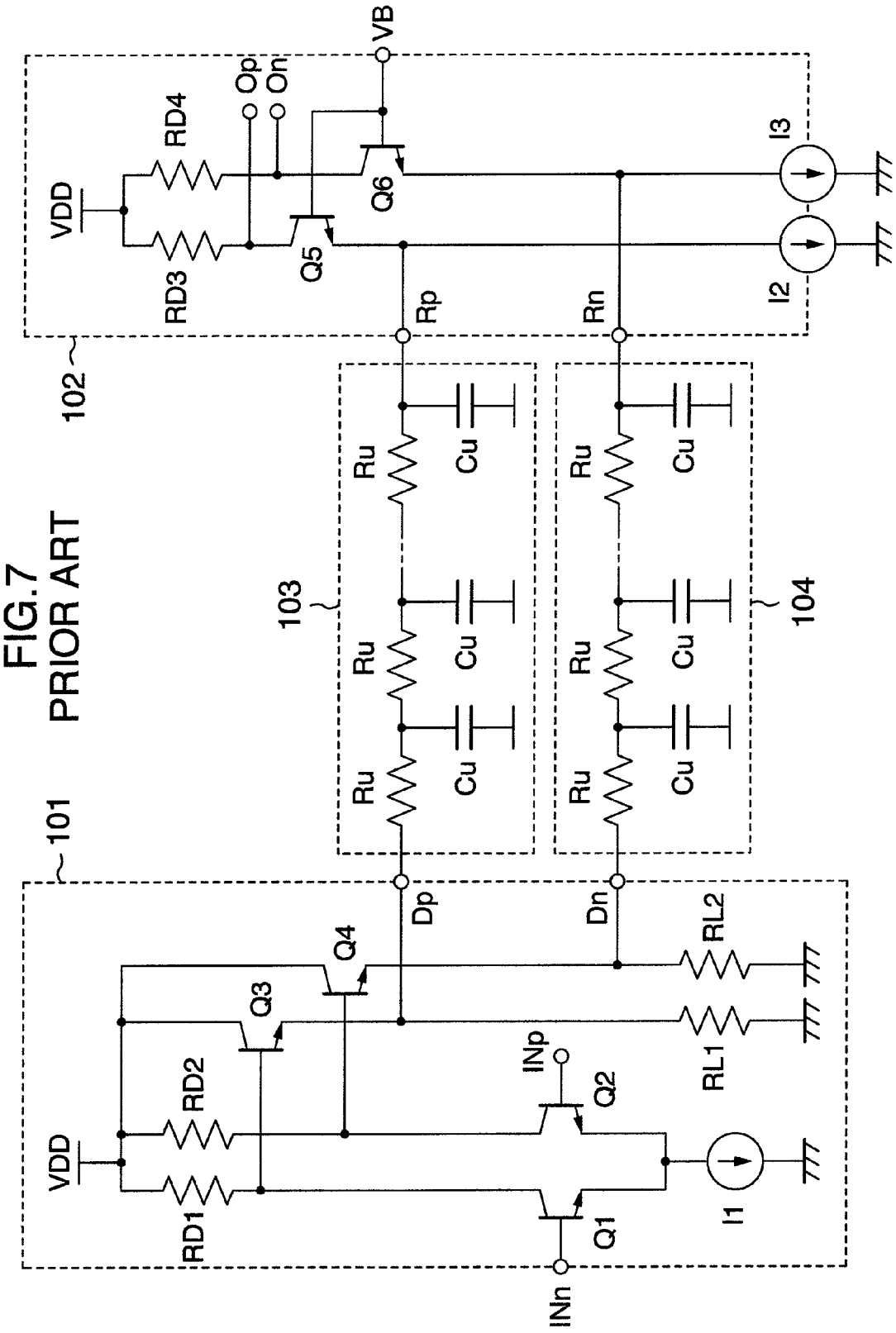
FIG. 7 is a configuration diagram of a conventional current transmission circuit formed of bipolar transistors and described in JP-A-7-147092.
Figure 8:
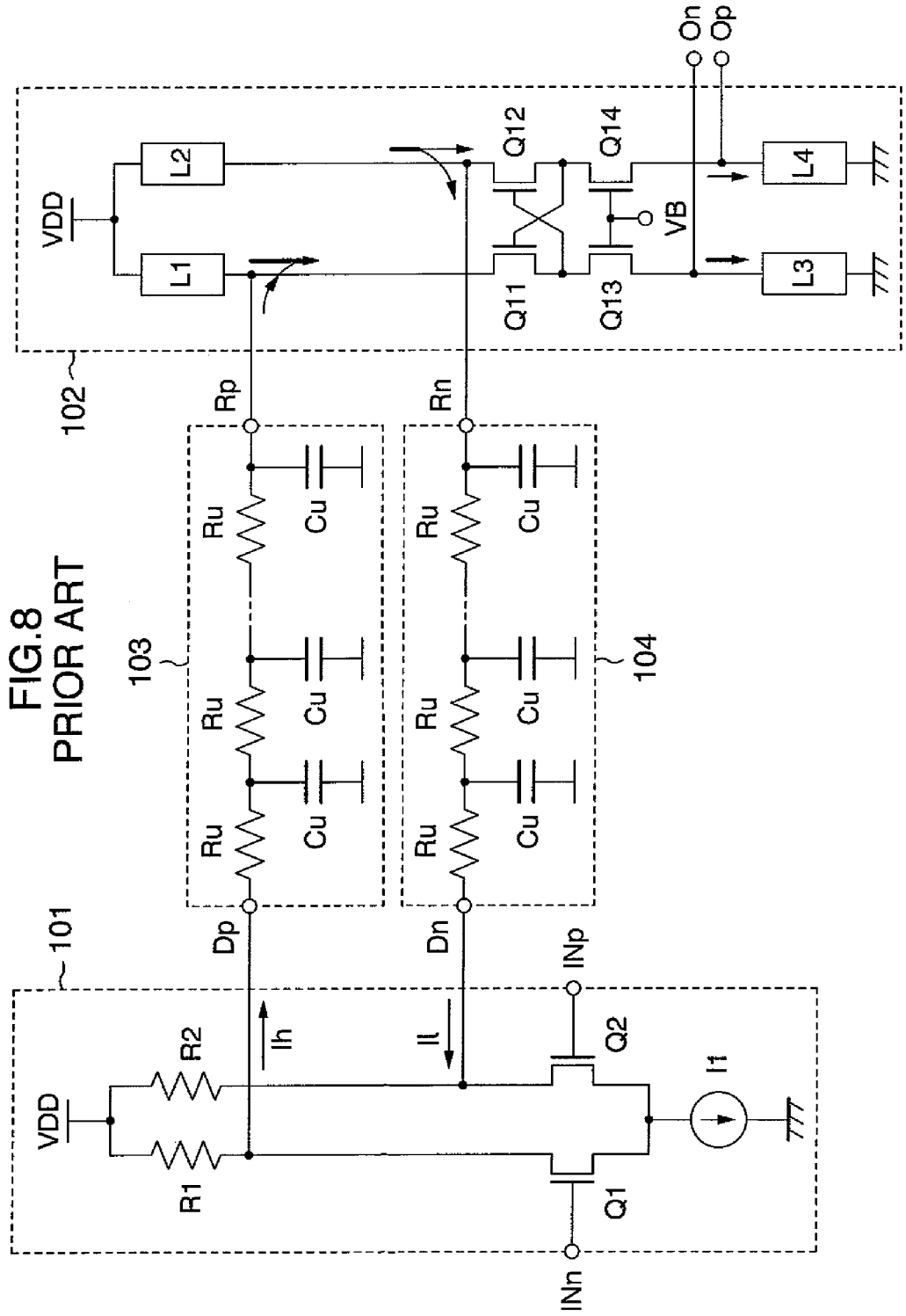
FIG. 8 is a configuration diagram of a conventional current transmission circuit formed of MOS transistors and described in JP-A-8-162942.
Figure 9:
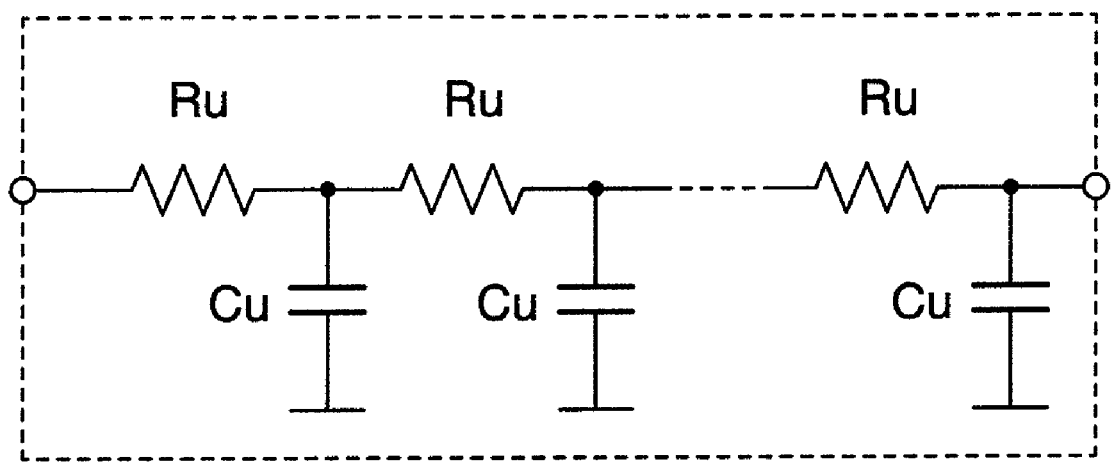
FIG. 9 shows an equivalent circuit of wiring formed on a semiconductor substrate.

FIG. 6 shows a circuit configuration of a principal part of a semiconductor device according to a fifth embodiment. In the present embodiment, the transmitter circuit 101 is formed of constant current sources Is1, Is2 and Idrv, and NMOS transistors M601 and M602 which constitute a current switch circuit. The receiver circuit 102 has the same configuration as that of the receiver circuit in the second embodiment shown in FIG. 3.

Current values of the constant current sources Is1, Is2 and Idrv are set equal to each other. A route through which the current of the constant current source Idrv flows depends upon the potential relation between the input terminals INp and INn. For example, if the potential at the input terminal INp becomes the high level and the potential at the input terminal INn becomes the low level, all of the current of the constant current source Idrv flows through the NMOS transistor M601. As a result, the current of the constant current source Is1 flows into the NMOS transistor M601, and the current of the constant current source Is2 flows from the output terminal Dp into the constant current source IP2 in the receiver circuit 102 via the wiring 103. As a result, the NMOS transistor M3 in the receiver circuit 102 is brought into the cutoff state, and the potential at the output terminal OUTp rises to the potential at the power supply VDD and becomes the high level. On the other hand, since no current flows to the sending end Dn of the transmitter circuit 101, no current flows through the wiring 104 either. Therefore, all of the current of the constant current source IN2 in the receiver circuit 102 flows through the NMOS transistor M4 and the load means L2. As a result, the low level is output to the output terminal OUTn because of a voltage drop generated across the load means L2 by this current. In this embodiment as well, the voltage signals at the output terminals OUTp and OUTn depend upon the constant current source IP2 and IN2 and the load means L1 and L2. Therefore, the voltage signals do not depend upon the wiring resistance Rt and stable signal transmission becomes possible.

The transmitter and receiver circuit between circuit blocks according to the present invention can be applied to, for example, signal transmission between a plurality of circuit blocks formed on a semiconductor substrate, and in particular to transmission between blocks with a long distance between blocks and large wiring distance.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
a first circuit block including a transmitter circuit;
a second circuit block including a receiver circuit; and
a wiring pair between blocks for transferring complementary current signals from paired first and second output terminals of the transmitter circuit to paired first and second input terminals of the receiver circuit,
wherein
the transmitter circuit has output impedance lower than wiring resistance of each wiring of the wiring pair between blocks,
the transmitter circuit receives one pair of complementary signals of the first circuit block, converts the pair of complementary signals of the first circuit block to one pair of complementary current signals, and outputs the pair of complementary current signals to the wiring pair between blocks via the first and second output terminals, and
the receiver circuit comprises:
a current receiver block; and
a level shifter circuit,
the current receiver block comprising:
first and second constant current sources respectively connected to the first and second input terminals;
a first NMOS transistor connected at a source thereof to a connection node between the first input terminal and the first constant current source and connected at a drain thereof to a first power supply via first load means;
a second NMOS transistor connected at a source thereof to a connection node between the second input terminal and the second constant current source and connected at a drain thereof to the first power supply via second load means;
third and fourth output terminals formed of the drains of the first and second NMOS transistors to output voltage signals to inside of the second circuit block; and
input impedance lower than wiring resistance of each wiring of the wiring pair between blocks,
the level shifter circuit connecting a signal which is the same in phase with the voltage signal at the third output terminal to a gate of the second NMOS transistor and connecting a signal which is the same in phase with the voltage signal at the fourth output terminal to a gate of the first NMOS transistor.

2. The semiconductor device according to claim 1, wherein the transmitter circuit, the receiver circuit and the wiring pair between blocks are formed on the same semiconductor substrate.

3. The semiconductor device according to claim 1, wherein the transmitter circuit comprises:
third and fourth input terminals for receiving complementary voltage signals of the first circuit block;
a third NMOS transistor connected at a gate thereof to the third input terminal, connected at a source thereof to the first output terminal, and connected at a drain thereof to a first power supply; and
a fourth NMOS transistor connected at a gate thereof to the fourth input terminal, connected at a source thereof to the second output terminal, and connected at a drain thereof to the first power supply.

4. The semiconductor device according to claim 1, wherein the transmitter circuit comprises:
third and fourth input terminals for receiving complementary voltage signals of the first circuit block;
a third NMOS transistor connected at a gate thereof to the third input terminal and connected at a source thereof to the second output terminal;
a fourth NMOS transistor connected at a gate thereof to the fourth input terminal and connected at a source thereof to the first output terminal; and
a transmitter-circuit constant current source connected to sources of the third and fourth NMOS transistors.

5. The semiconductor device according to claim 4, wherein a first branch constant current source is further connected to the source of the third NMOS transistor, and
a second branch constant current source is further connected to the source of the fourth NMOS transistor.

6. The semiconductor device according to claim 1, wherein the level shifter circuit comprises:
a third NMOS transistor connected at a gate thereof to the third output terminal and connected at a drain thereof to the gate of the first NMOS transistor and third load means;
a fourth NMOS transistor connected at a gate thereof to the fourth output terminal and connected at a drain thereof to the gate of the second NMOS transistor and fourth load means; and
a level-shifter-circuit constant current source connected to sources of the third and fourth NMOS transistors.

7. A semiconductor device comprising:
a first circuit block including a transmitter circuit;
a second circuit block including a receiver circuit; and
a wiring pair between blocks for transferring complementary current signals from paired first and second output terminals of the transmitter circuit to paired first and second input terminals of the receiver circuit,
wherein
the transmitter circuit has output impedance lower than wiring resistance of each wiring of the wiring pair between blocks,
the transmitter circuit receives one pair of complementary signals of the first circuit block, converts the pair of complementary signals of the first circuit block to one pair of complementary current signals, and outputs the pair of complementary current signals to the wiring pair between blocks via the first and second output terminals, and
the receiver circuit comprises:

first and second constant current sources respectively connected to the first and second input terminals;

a first NMOS transistor connected at a source thereof to a connection node between the first input terminal and the first constant current source and connected at a drain thereof to a first power supply via first load means;

a second NMOS transistor connected at a source thereof to a connection node between the second input terminal and the second constant current source and connected at a drain thereof to the first power supply via second load means;

third and fourth output terminals formed of the drains of the first and second NMOS transistors to output voltage signals, the third output terminal being connected to the gate of the second NMOS transistor, the fourth output terminal being connected to the gate of the first NMOS transistor; and input impedance lower than wiring resistance of each wiring of the wiring pair between blocks.

* * * * *